(12) United States Patent
Kajimoto et al.

(10) Patent No.: US 7,376,016 B2
(45) Date of Patent: May 20, 2008

(54) METHOD OF WRITING TO NON-VOLATILE SEMICONDUCTOR MEMORY DEVICE STORING INFORMATION DEPENDING ON VARIATION IN LEVEL OF THRESHOLD VOLTAGE

(75) Inventors: Takeshi Kajimoto, Tokyo (JP); Takeshi Nakayama, Tokyo (JP); Shinichi Kobayashi, Tokyo (JP); Takashi Kono, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 117 days.

(21) Appl. No.: 11/488,621

(22) Filed: Jul. 19, 2006

(65) Prior Publication Data

US 2007/0019478 A1    Jan. 25, 2007

(30) Foreign Application Priority Data

Jul. 20, 2005    (JP)    ............................. 2005-209648

(51) Int. Cl.
*G11C 11/34*    (2006.01)

(52) U.S. Cl. .............................. 365/185.22; 365/185.03

(58) Field of Classification Search ........... 365/185.22, 365/185.03, 185.28
See application file for complete search history.

(56) References Cited

U.S. PATENT DOCUMENTS

| | | | | | |
|---|---|---|---|---|---|
| 5,570,315 | A | * | 10/1996 | Tanaka et al. | ......... 365/185.22 |
| 5,602,789 | A | * | 2/1997 | Endoh et al. | .......... 365/185.03 |
| 6,128,229 | A | * | 10/2000 | Nobukata | .............. 365/185.22 |
| 6,487,122 | B2 | * | 11/2002 | Shibata et al. | ......... 365/185.22 |

FOREIGN PATENT DOCUMENTS

JP    2000-123581 A    4/2000

* cited by examiner

*Primary Examiner*—Anh Phung
(74) *Attorney, Agent, or Firm*—McDermott Will & Emery LLP

(57) ABSTRACT

In a flash memory, after an initial write operation ends, each bit line associated with a memory cell subjected to a write is precharged and each bit line associated with a memory cell that is not subjected to the write is discharged and verified to detect a memory cell low in threshold voltage and a memory cell thus detected is subjected to an additional write. The verification can be verified without being affected by a current flowing through the memory cell that is not subjected to the write. All memory cells can have their respective threshold voltages set accurately.

9 Claims, 16 Drawing Sheets

FIG.6

| | | | AFTER S1 | EARLIER WRITE OPERATION | | | | | LATER WRITE OPERATION | | | |
|---|---|---|---|---|---|---|---|---|---|---|---|---|
| | | | | AFTER S2 | WRITE | AFTER S4 | AFTER S5 | AFTER S2 | WRITE | AFTER S4 | AFTER S5 |
| CELL SUBJECTED TO WRITE | CELL IN WHICH WRITE IS FAST DONE | $V_{TH}$ | LOW | LOW | EFFECTED | HIGH | HIGH | HIGH | INHIBITED | HIGH | HIGH |
| | | GBL | — | L | — | $V_{SH}$ | $V_{SH}$ | $V_{INH}$ | $V_{INH}$ | $V_{SH}$ | $V_{SH}$ |
| | | SL | 1 | 1 | 1 | 1 ↑ | 0 | 0 | 0 | 0 | 0 |
| | CELL REQUIRING TIME FOR WRITE TO BE COMPLETED | $V_{TH}$ | LOW | LOW | EFFECTED | LOW | LOW | LOW | EFFECTED | HIGH | HIGH |
| | | GBL | — | L | — | $V_{SL}$ | $V_{SL}$ | L | — | $V_{SH}$ | $V_{SH}$ |
| | | SL | 1 | 1 | 1 | 1 | 1 | 1 | 1 | 1 ↑ | 0 |
| CELL NOT SUBJECTED TO WRITE | CELL HIGH IN $V_{TH}$ | $V_{TH}$ | HIGH | HIGH | INHIBITED | HIGH | HIGH | HIGH | INHIBITED | HIGH | HIGH |
| | | GBL | — | $V_{INH}$ | $V_{INH}$ | $V_{SH}$ | $V_{SH}$ | $V_{INH}$ | $V_{INH}$ | $V_{SH}$ | $V_{SH}$ |
| | | SL | 0 | 0 | 0 | 0 | 0 | 0 | 0 | 0 | 0 |
| | CELL LOW IN $V_{TH}$ | $V_{TH}$ | LOW | LOW | INHIBITED | LOW | LOW | LOW | INHIBITED | LOW | LOW |
| | | GBL | — | $V_{INH}$ | $V_{INH}$ | $V_{SL}$ | $V_{SL}$ | $V_{INH}$ | $V_{INH}$ | $V_{SL}$ | $V_{SL}$ |
| | | SL | 0 | 0 | 0 | 0 | 0 | 0 | 0 | 0 | 0 |

$V_{SH}$ : HIGH LEVEL OF GBL, $V_{SL}$ : LOW LEVEL OF GBL, $V_{INH}$ : WRITE INHIBITION VOLTAGE $V_{RW1}$, $V_{RW2}$, $V_{RW3}$:
   WL LEVEL IN READ $V_{VR1}$, $V_{VR2}$, $V_{VR3}$:
   WL LEVEL IN VERIFICATION $V_{LT1}$, $V_{LT2}$, $V_{LT3}$:
   WL LEVEL IN MAKING A DECISION
   IN CONNECTION WITH FLARE

------ : $V_{TH}$ DISTRIBUTION AFTER S6

──── : $V_{TH}$ DISTRIBUTION AFTER S9

⊘ CELL HIGH IN VTH
○ CELL LOW IN VTH

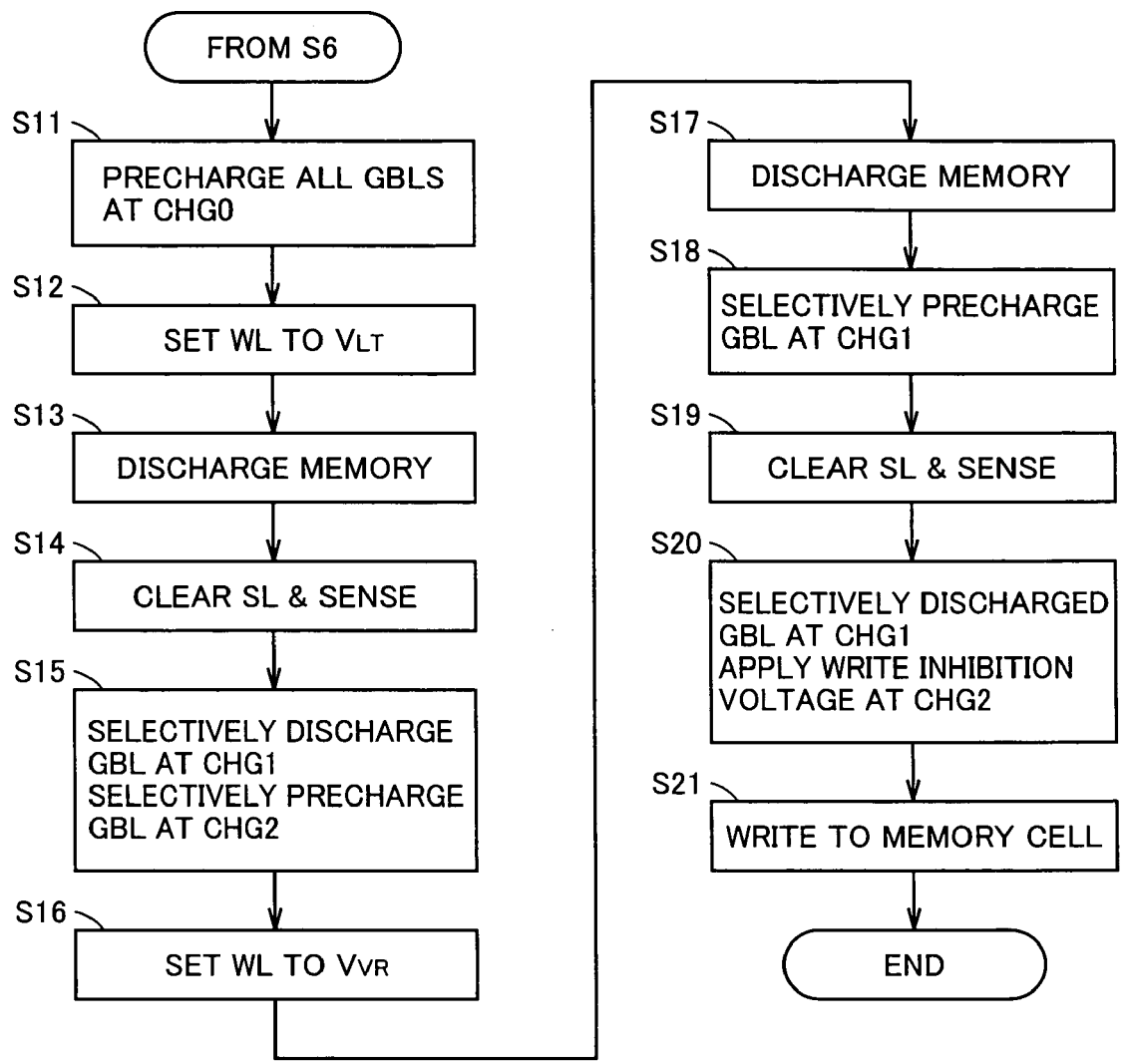

FIG.10

| | | AFTER S11 | AFTER S13 | AFTER S14 | AFTER S15 | AFTER S17 | AFTER S18 | AFTER S19 | AFTER S20 | RESULT |
|---|---|---|---|---|---|---|---|---|---|---|
| CELL WITH V<sub>TH</sub> NO SMALLER THAN V<sub>VR</sub> | GBL | V<sub>SH</sub> | V<sub>SH</sub> | V<sub>SH</sub> | V<sub>SH</sub> | V<sub>SH</sub> | V<sub>SH</sub> | V<sub>SH</sub> | V<sub>INH</sub> | |
| | SLR | H | H | H | H | H | H | H | H | |
| | SLS | L | L | L | L | L | L | L | L | |
| CELL WITH V<sub>TH</sub> NO LARGER THAN V<sub>VR</sub> & NO SMALLER THAN V<sub>LT</sub> | GBL | V<sub>SH</sub> → V<sub>SL</sub> | V<sub>SL</sub> | V<sub>SH</sub> | V<sub>SH</sub> → V<sub>SL</sub> | V<sub>SL</sub> | V<sub>SL</sub> | V<sub>SL</sub> | GND | SUBJECTED TO ADDITIONAL WRITE |
| | SLR | H | H → L | L | H | H | H → L | L | L | |
| | SLS | L | L → H | H | L | L | L → H | H | H | |
| CELL WITH V<sub>TH</sub> NO LARGER THAN V<sub>LT</sub> | GBL | V<sub>SH</sub> | V<sub>SH</sub> | V<sub>SL</sub> | GND | GND | V<sub>SH</sub> | V<sub>SH</sub> | V<sub>INH</sub> | |
| | SLR | H | H | L → | L | L | L → | H | H | |
| | SLS | L | L | H → | H | H | H → | L | L | |

V<sub>SH</sub>: HIGH LEVEL OF GBL, V<sub>SL</sub>: LOW LEVEL OF GBL, V<sub>INH</sub>: WRITE INHIBITION VOLTAGE

FIG.14

| | | AFTER S13 | AFTER S14 | AFTER S33 | AFTER S35 | AFTER S17 | AFTER S18 | AFTER S19 | AFTER S37 | RESULT |
|---|---|---|---|---|---|---|---|---|---|---|
| CELL WITH $V_{TH}$ NO SMALLER THAN $V_{VR}$ | GBL | $V_{SH}$ | $V_{SH}$ | $V_{SL}$ → | → $V_{SH}$ | $V_{SH}$ | $V_{SH}$ | $V_{SH}$ | $V_{INH}$ | |
| | SLR | H | H | L | L | L → | L | H | H | |
| | SLS | L | L | H | H | H → | H | L | L | |
| CELL WITH $V_{TH}$ NO LARGER THAN $V_{VR}$ & NO SMALLER THAN $V_{LT}$ | GBL | $V_{SH}$ | $V_{SH}$ | $V_{SL}$ → | → $V_{SH}$ | → $V_{SL}$ | $V_{SL}$ | $V_{SL}$ | → GND | SUBJECTED TO ADDITIONAL WRITE |
| | SLR | H | H | L | L | L | L | L | L | |
| | SLS | L | L | H | H | H | H | H | H | |
| CELL WITH $V_{TH}$ NO LARGER THAN $V_{LT}$ | GBL | $V_{SL}$ | $V_{SL}$ | $V_{SH}$ | GND | GND | $V_{SH}$ | $V_{SH}$ | $V_{INH}$ | |
| | SLR | H → | L | H | H | H | H | H | H | |
| | SLS | L → | H | L | L | L | L | L | L | |

$V_{SH}$ : HIGH LEVEL OF GBL, $V_{SL}$ : LOW LEVEL OF GBL, $V_{INH}$ : WRITE INHIBITION VOLTAGE $V_{RW1}, V_{RW2}, V_{RW3}$ :
   WL LEVEL IN READ $V_{VR1}, V_{VR2}, V_{VR3}$ :
   WL LEVEL IN VERIFICATION

------ : $V_{TH}$ DISTRIBUTION AFTER S6

——— : $V_{TH}$ DISTRIBUTION AFTER S52

METHOD OF WRITING TO NON-VOLATILE SEMICONDUCTOR MEMORY DEVICE STORING INFORMATION DEPENDING ON VARIATION IN LEVEL OF THRESHOLD VOLTAGE

BACKGROUND OF THE INVENTION

1. Field of the Invention

The present invention relates generally to methods of writing to non-volatile semiconductor memory devices and particularly to those effective when they are applied to products that adopt multi-value storage in NOR, NAND, AND and other similar flash memories.

2. Description of the Background Art

Flash memory has several thousands to several tens of thousands of memory cells referred to as sectors or pages concurrently subjected to a write or a read. A write operation utilizes that electrons introduced into a floating gate increase a memory cell in threshold voltage $V_{TH}$, and whether threshold voltage $V_{TH}$ as desired is reached is confirmed by a read operation referred to as verification and if it is not attained, further electrons are repeatedly introduced and the verification is repeated. In the verification (or read) operation a decision is made from whether a constant current flows through the memory cell. If the current no longer flows, a decision is made that threshold voltage $V_{TH}$ as desired has been reached.

However, this series of operations is performed for several thousands to several tens of thousands of memory cells concurrently. As such, when, as observed for example in an earlier stage of a write process, a majority of memory cells still has a write insufficiently done, i.e., a current still flows, there is a possibility that a ground line (a source line) serving as a common current path floats in potential, a write voltage $V_{GS}$ applied between the gate and source of a MOS transistor configuring the memory cell is effectively reduced, and a decision is erroneously made that a cell in fact in an on state is in an off state. As a result, this memory cell, with its threshold voltage $V_{TH}$ still low, is assumed to have the write completed.

In contrast, when, as observed in a later stage of the write process, a majority of memory has a write completed, i.e., the current no longer flows through the memory cells, the ground line no longer floats in potential and a correct write voltage $V_{GS}$ is applied to a cell. As such, whether a cell is in the on or off state is accurately determined. Thus the write will be done up to a correct threshold voltage $V_{TH}$.

As such, the level of a write to a memory cell depends on whether it completes in an earlier stage of the write process or continues to a later stage thereof. As a result, threshold voltage $V_{TH}$ as written will have a range, which disadvantageously prevents threshold voltage $V_{TH}$ from having a narrow distribution required for multi-value storage in particular.

Accordingly, Japanese Patent Laying-Open No. 2000-123581 proposes a method in which after a write to all memory cells ends, data-latching, verification and a write operation are again performed and if there is any cell low in threshold voltage it is again subjected to a write.

In a conventional method, however, data-latching, verification and the write operation are simply repeated twice, which is insufficient to provide threshold voltage $V_{TH}$ having a narrow distribution.

SUMMARY OF THE INVENTION

Accordingly, the present invention mainly contemplates a method of writing to a non-volatile semiconductor memory device that can provide a narrowed distribution of a threshold voltage.

The present method of writing to a non-volatile semiconductor memory device is a method of writing information to each of a plurality of memory cells arranged in a plurality of rows and a plurality of columns and each storing information by variation in threshold voltage in a non-volatile semiconductor memory device having such plurality of memory cells, a plurality of word lines associated with the plurality of rows, respectively, a plurality of bit lines associated with the plurality of columns, respectively, and a plurality of sense latches associated with the plurality of bit lines, respectively, the method including the steps of: (1) causing each sense latch corresponding to a memory cell of a plurality of memory cells associated with one selected word line that is subjected to a write to latch a first signal, and causing each sense latch associated with a memory cell that is not subjected to the write to latch a second signal; (2) performing the write to and verifying each of the plurality of memory cells associated with the selected word line that is associated with the sense latch latching the first signal, and causing each sense latch associated with the memory cell the write to which is completed to latch the second signal; and (3) re-verifying the memory cell subjected to the write, and causing each sense latch associated with the memory cell such detected that the write therein is insufficiently done to latch the first signal, wherein in re-verifying the memory cell subjected to the write, each bit line associated with the memory cell that is not subjected to the write is previously discharged.

In the present invention, in a later stage of a write process, each bit line associated with a memory cell that is not subjected to a write is discharged and verification is performed. The verification can be performed without being affected by a current flowing through the memory cell that is not subjected to the write. As such, a memory cell low in threshold voltage having passed the verification in an earlier stage of a write process can also have a write up to the level of a correct threshold voltage equivalent to that of a memory cell that passes the verification in a later stage of the write process. All memory cells can have their threshold voltages set correctly and a narrowed threshold voltage distribution can thus be achieved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 exemplary indicates how a memory cell in the write operation represented in FIG. 5 varies in threshold voltage and the like.

FIG. 9 is a flow chart for specifically illustrating an operation performed after the flare check indicated in FIG. 5.

FIG. 10 exemplary shows how a bit line in a write operation shown in FIG. 9 varies in level.

FIG. 14 exemplary shows how a bit line in a write operation shown in FIG. 13 varies in level.

DESCRIPTION OF THE PREFERRED EMBODIMENTS

First Embodiment

Figure 1:
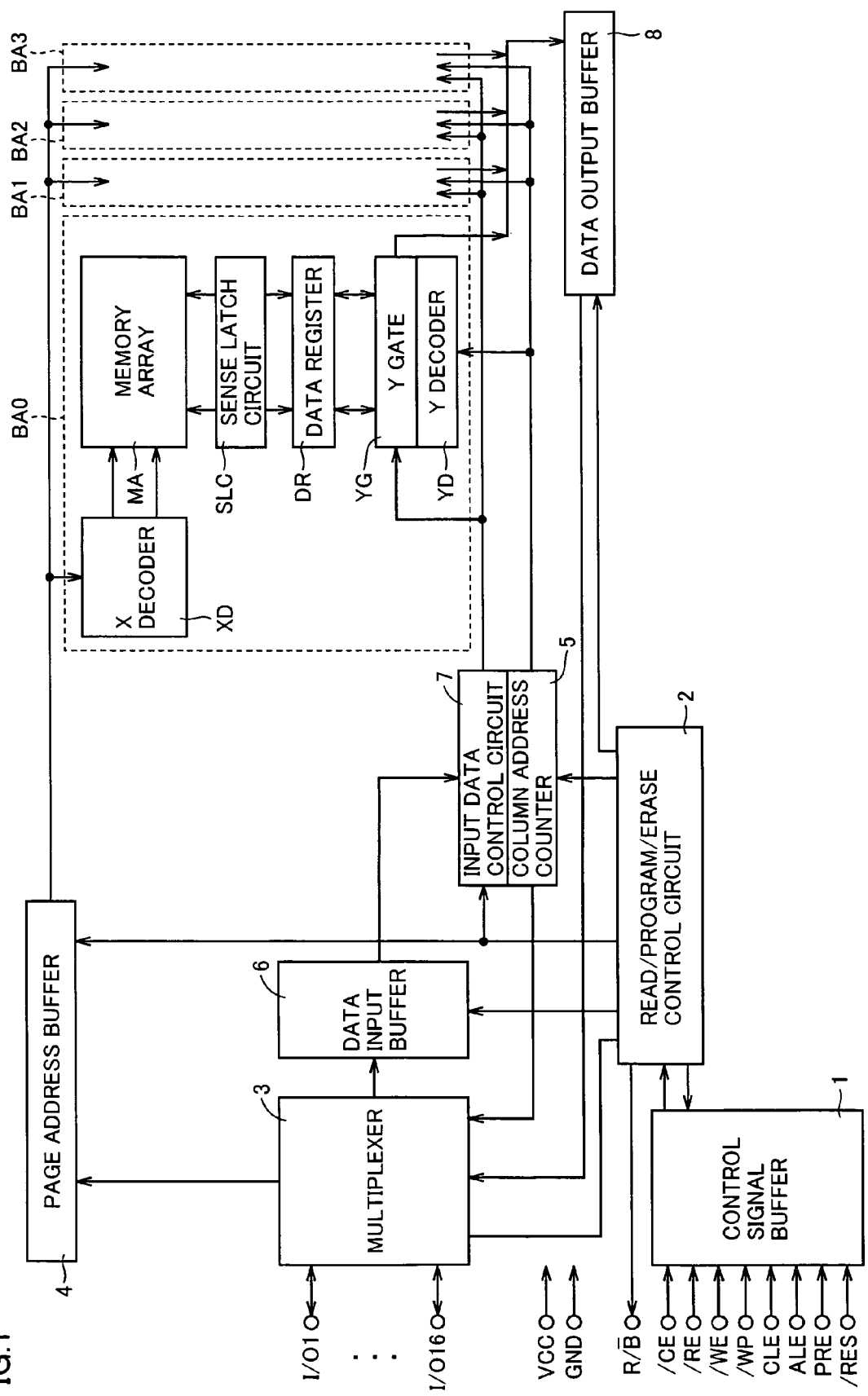
FIG. 1 is a block diagram generally showing a configuration of a flash memory in a first embodiment of the present invention.

FIG. 1 is a block diagram generally showing a configuration of a flash memory in a first embodiment of the present invention. In FIG. 1, this flash memory is provided with a plurality of banks BA0 to BA3 (four in the figure. Each of banks BA0 to BA3 includes a memory array MA for storing information, an X decoder XD for designating a row address in memory array MA in accordance with a row address signal, a Y decoder YD for designating a column address in memory array MA in accordance with a column address signal, a Y gate YG for transmitting and receiving data to and from memory array MA, a data register DR for temporarily holding data, and a sense latch circuit SLC for detecting, amplifying and holding data.

A read/program/erase control circuit 2 generally controls the flash memory in accordance with control signals /CE, /RE, /WE . . . provided via a control signal buffer 1. A row address signal is provided to X decoder XD in each of banks BA0 to BA3 via a multiplexer 3 and a page address buffer 4. A column address counter 5 generates a column address signal which is in turn provided to Y decoder YD in each of banks BA0 to BA3.

A write data signal is provided to Y gate YG in each of banks BA0 to BA3 via multiplexer 3, a data input buffer 6 and an input data controlling circuit 7, and furthermore, written via data register DR and sense latch circuit SLC to memory array MA at a designated address. A data signal read from a designated address in memory array MA is externally output via sense latch circuit SLC, data register DR, Y gate YG, data output buffer 8 and multiplexer 3.

Figure 2:
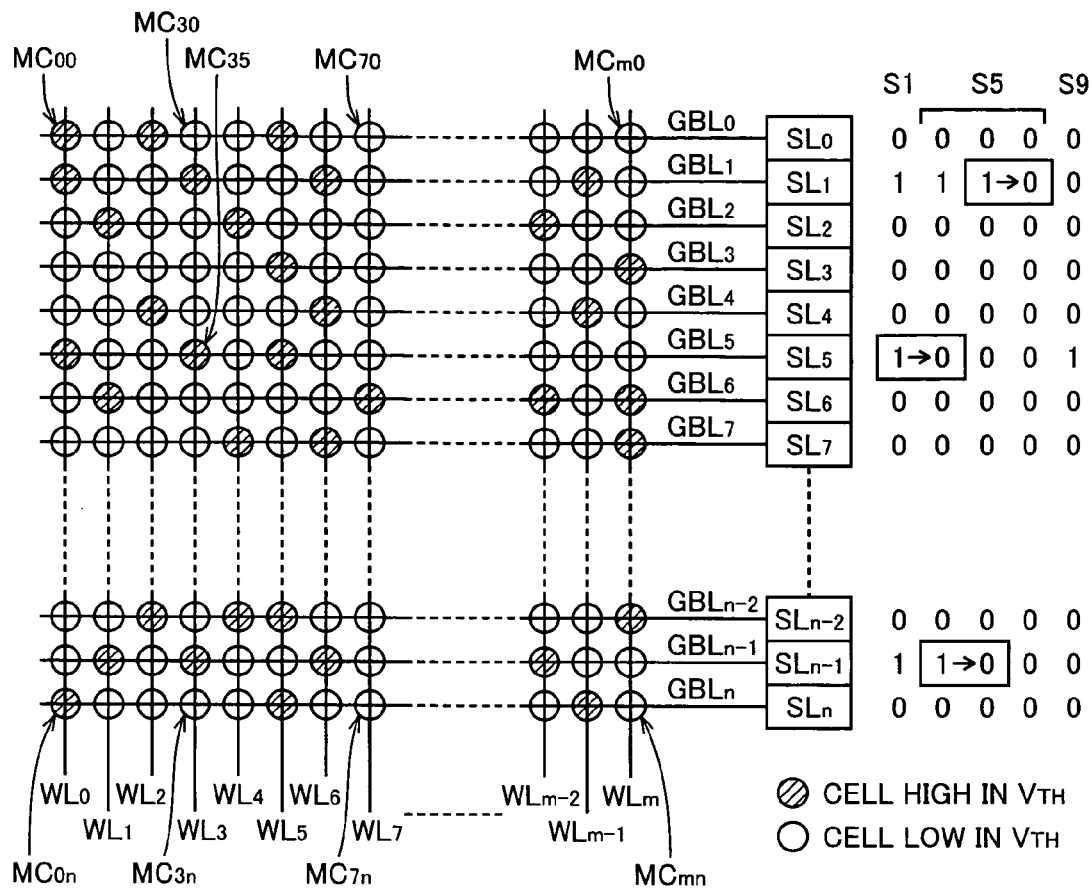
FIG. 2 shows a configuration of a memory array shown in FIG. 1.

FIG. 2 shows a configuration of memory array MA shown in FIG. 1. In FIG. 2 memory array MA includes a plurality of memory cells MCs arranged in a plurality of rows and a plurality of columns, a plurality of word lines $WL_o$-$WL_m$ associated with the plurality of rows, respectively, and a plurality of bit lines $GBL_o$-$GBL_n$ associated with the plurality of columns, respectively. Each memory cell MC includes a MOS transistor storing information as threshold voltage varies. At ends of bit lines $GBL_o$-$GBL_n$, respectively, sense latches $SL_o$-$SL_n$ are arranged, respectively, and each sense latch SL controls writing to/reading from memory cell MC. Each word line WL is driven by X decoder XD.

Figure 3:
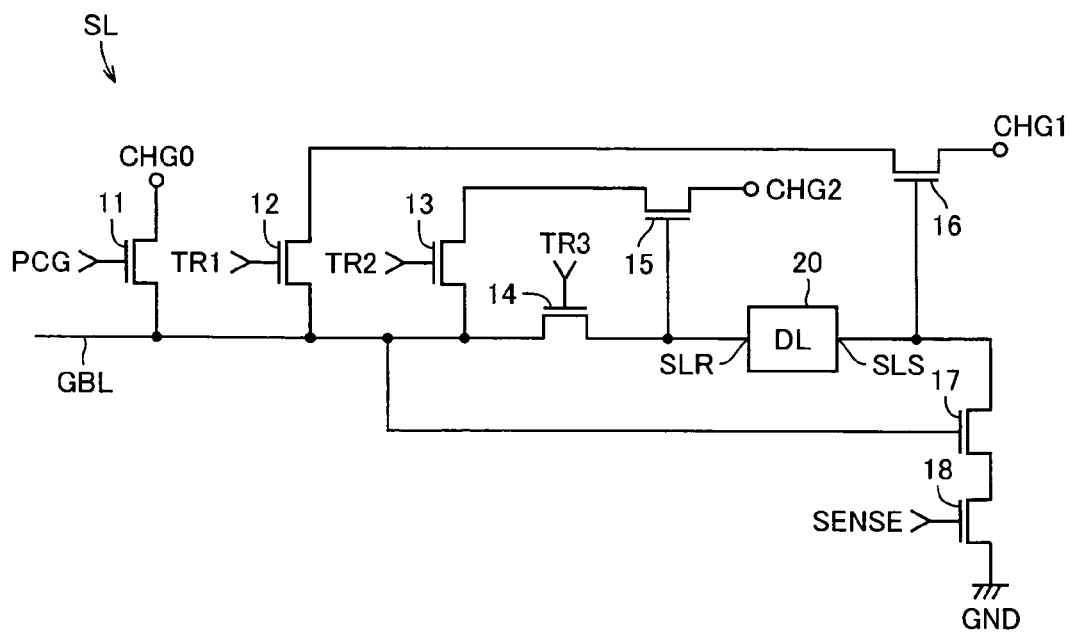
FIG. 3 is a circuit block diagram showing a configuration of a sense latch shown in FIG. 2.

FIG. 3 is a circuit diagram showing a configuration of sense latch SL shown in FIG. 2. In FIG. 3 sense latch SL includes N channel MOS transistors 11-18 and a data latch 20. When a signal PCG is set high, N channel MOS transistor 11 conducts and bit line GBL is connected to a node CHG0. When data latch 20 has one node SLS going high and a signal TR1 is also set high, N channel MOS transistors 12 and 16 conduct and bit line GBL is connected to a node CHG1. When data latch 20 has the other node SLR going high and a signal TR2 is also set high, N channel MOS transistors 13 and 15 conduct and bit line GBL is connected to a node CHG2. When a signal TR3 is set high, N channel MOS transistor 14 conducts and bit line GBL is connected to node SLR. When bit line GBL is set high and a signal SENSE is also set high, N channel MOS transistors 17 and 18 conduct and node SLS is grounded.

Figure 4:
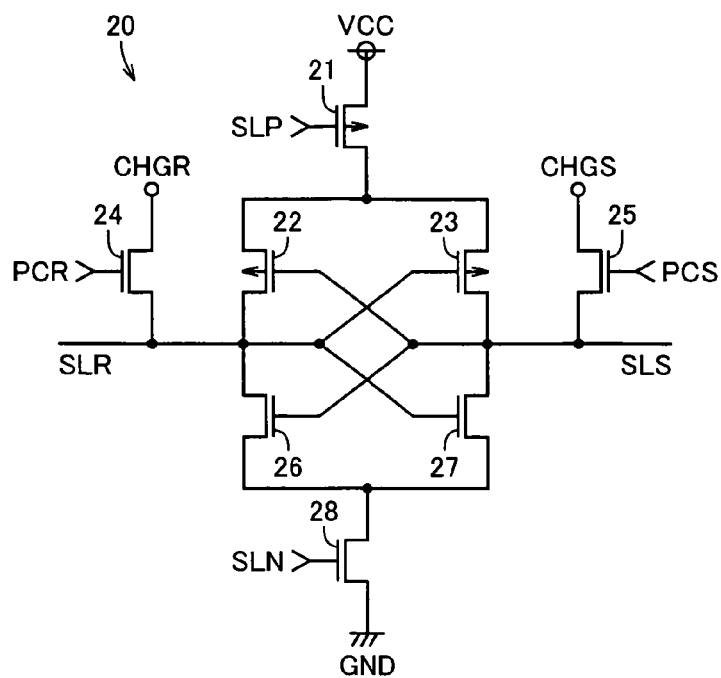
FIG. 4 is a circuit diagram showing a configuration of a data latch shown in FIG. 3.

FIG. 4 is a circuit diagram showing a configuration of data latch 20 shown in FIG. 3. In FIG. 4 data latch 20 includes P channel MOS transistors 21-23 and N channel MOS transistors 24-28. When signals PCR and PCS are set high, N channel MOS transistors 24 and 25 conduct and nodes SLR and SLS are connected to nodes CHGR and CHGS, respectively. When a signal SLN is set high, N channel MOS transistor 28 conducts and N channel MOS transistors 26 and 27 have their sources grounded. When a signal SLP is set low, P channel MOS transistor 21 conducts and a power supply potential VWC is applied to P channel MOS transistors 22 and 23 at their sources. Transistors 22, 23, 26 and 27 configure a differential amplification circuit.

Figure 5:
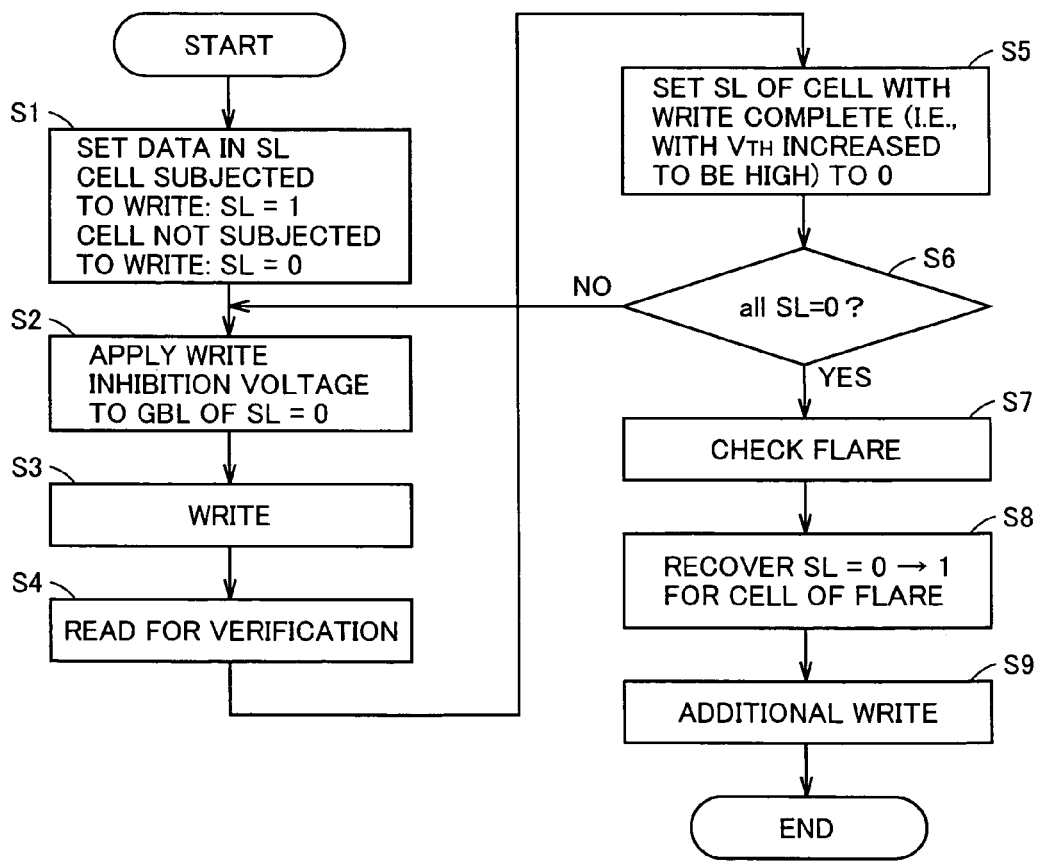
FIG. 5 is a flow chart for illustrating a write operation of the flash memory shown in FIG. 1.

FIG. 5 is a flow chart for illustrating a write operation of this flash memory. In FIG. 5, initially, data of 1 or 0 is set in each of sense latches $SL_o$-$SL_n$ by input data control circuit 7 or the like (S1). In accordance with the data, each sense latch SL allows a write inhibition voltage $V_{INH}$ to be selectively applied to a bit line GBL of bit lines $GBL_o$-$GBL_n$ for which a write is unwanted (S2). In a subsequent, write operation, of word lines $WL_o$-$WL_m$, one word line WL (in FIG. 2, $WL_3$) is set high in potential and a high potential charged in a charge line (not shown) is discharged through selected memory cells $MC_{30}$-$MC_{3n}$ to bit line GBL. If at that time write inhibition voltage $V_{INH}$ is applied to bit line GBL, discharging does not occur, because of a small difference in potential. If the voltage is not applied to the bit line, hot electrons generated in discharging are injected into memory cell MC and increase the memory cell in threshold voltage $V_{TH}$ (S3).

Subsequently, bit lines $GBL_o$-$GBL_n$ are precharged to a desired potential and word line $WL_3$ is set at a predetermined verification potential $V_{VR}$. As a result, in bit line GBL associated with memory cell MC in which a write is insufficiently done, bit line potential is discharged as memory cell MC is low in threshold voltage $V_{TH}$. In a bit line GBL associated with memory cell MC in which a write is completed, in contrast, bit line GBL's precharged potential is maintained as memory cel MC is high in threshold voltage $V_{TH}$. This is a read for verification (S4), and via differential amplification at sense latch SL, data of sense latch SL connected to cell MC in which a write is completed is changed from 1 to 0 (S5).

FIG. 6 represents this series of operations for four types of memory cells MCs. Of memory cells MCs subjected to a write, a cell MC in which the write is fast done has threshold voltage $V_{TH}$ becoming high in an earlier write operation, and the sense latch SL has its data set to 0 and write inhibition voltage $V_{INH}$ is applied to bit line GBL. Of memory cells MC subjected to the write, a cell MC which requires time before the write therein is completed does not have threshold voltage $V_{TH}$ becoming high at an earlier write operation and sense latch SL has its data unchanged, remaining 1. In a later write operation, threshold voltage $V_{TH}$ becomes high and sense latch SL has its data set to 0. For memory cell MC that is not subjected to a write, whether threshold voltage $V_{TH}$ may be high or low, sense latch SL has its data set to 0 and write inhibition voltage $V_{INH}$ is applied to bit line GBL.

In the example shown in FIG. 2, memory cell MC35 connected to bit line $GBL_5$ has threshold voltage $V_{TH}$ attaining a desired value when it is first subjected to a write and sense latch SL5 has its data changed from 1 to 0 for the sake of illustration. However, memory cells $MC_{31}$ and $MC_{3n-1}$ connected to sense latches $SL_1$ and $SL_{n-1}$ are still low in threshold voltage $V_{TH}$ and sense latches $SL_1$ and $SL_{n-1}$ have their data remaining 1. As a result, step S6 does not provide a decision that all SLs=0. Accordingly the control returns to step S2 and steps S2-S6 will be repeated. A write is thus repeated and thereafter when memory cells $MC_{31}$ and $MC_{3n-1}$ also have threshold voltage $V_{TH}$ attaining the desired value, all sense latches SLs have their data set to 0 and the series of write operation completes.

Steps S1-S6 are the same as conventional. In the present invention thereafter, as indicated in FIG. 5 at steps S7-S9, a flare check is performed latched data is accordingly recovered, and an additional write is performed to resolve the aforementioned disadvantage. A series of operations from the flare check to the additional write may be performed in some embodiments, which will be described in order. Before that, reference will be made to FIG. 7 to describe the purpose of the flare check and a method thereof.

Figure 7:
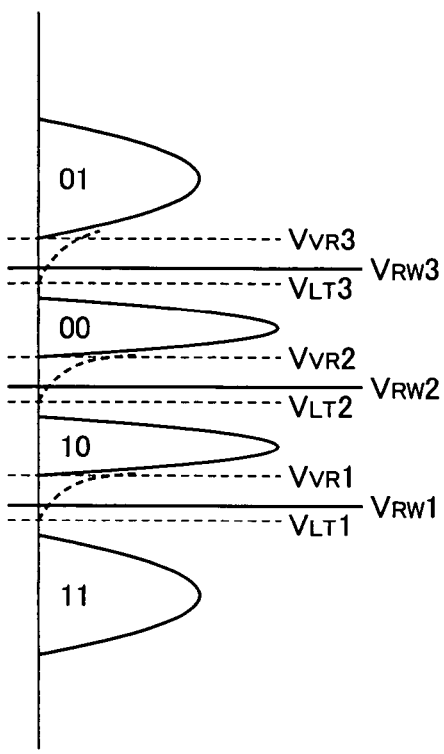
FIG. 7 is a diagram for illustrating a flare check indicated in FIG. 5.

FIG. 7 shows a relationship between a distribution of $V_{TH}$ and a level applied to make a decision for multi-value (4-value) storage. For multi-value storage, providing a narrowed $V_{TH}$ distribution is an essential requirement. In a verification operation performed immediately after a write, as has been aforementioned, a word line level is set as $V_{VR}$ and it is confirmed that memory cell MC has threshold voltage $V_{TH}$ equal to or higher than that level. Thus the $V_{TH}$ distribution is inherently a distribution as indicated by a solid line, and if in a read operation the word line level is set at $V_{RW}$ lower than $V_{VR}$, then between the level applied to make a decision and the distribution a predetermined operation margin can be ensured and it is expected that a steady read can be performed.

Figure 8A:
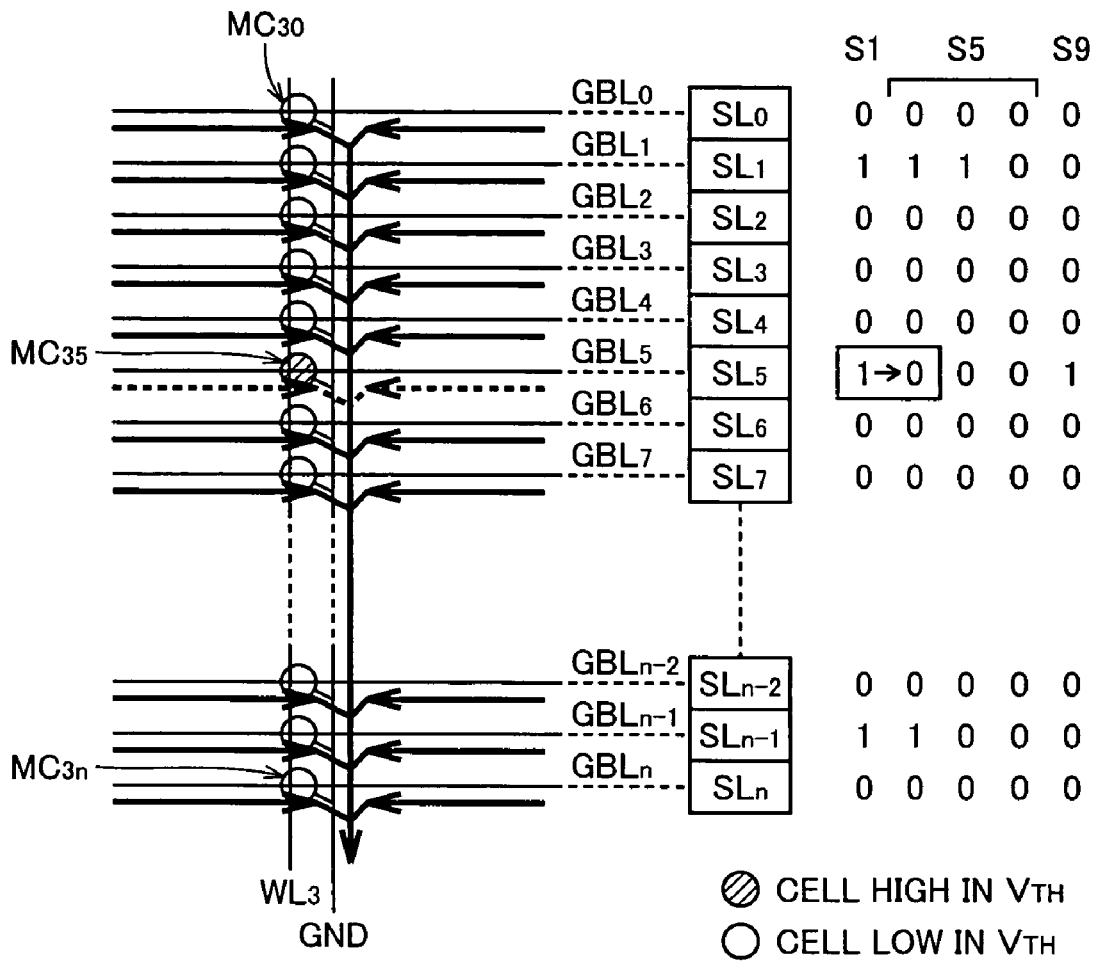
FIGS. 8A and 8B are other diagram s for illustrating the flare check indicated in FIG. 5.
Figure 8B:
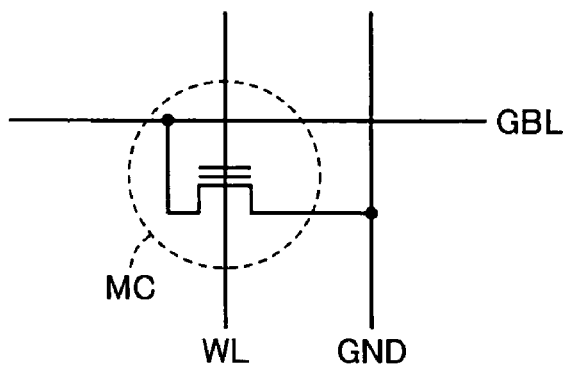

In reality, however, a write operation is performed for several thousands to several tens of thousands of memory cells MCs concurrently. As such, in an earlier stage of a write process when, as shown in FIGS. 8A and 8B, a majority of memory cells MCs still has a write insufficiently done, i.e., a current still flows, there is a possibility that a ground line serving as a common current path floats in (source) potential, a voltage $V_{VR}$ applied between the gate and source of a MOS transistor configuring memory cell MC is effectively reduced, and a decision is erroneously made that cell MC in fact in the on state is in the off state. As a result, that memory cell MC, with its threshold voltage $V_{TH}$ still low, is assumed to have the write completed and the distribution of threshold voltage VTH including cell MC in which the write is completed in a later stage of the write process would be a distribution having a flare pulled downward, as indicated in FIG. 7 by a broken line. The flare check is performed to detect such a cell MC. More specifically, it is performed by taking after a write an exclusive disjunction (EX-OR) of a result of reading at word line level $V_{VR}$ in verification and a result of reading at word line level $V_{LT}$ applied to make a decision in connection with the flare.

FIG. 9 is a flow chart for specifically illustrating steps S7-S9 of FIG. 5, and FIG. 10 indicates the potential of bit line GBL and the variation in level of each of nodes SLR and SLS of sense latch SL for $V_{TH} \geq V_{VR}$, $V_{VR} \geq V_{TH} \geq V_{LT}$ and $V_{LT} \geq V_{TH}$ for a total of three memory cells MCs.

The FIG. 9 steps S1-S18 correspond to the FIG. 5 step S7. The FIG. 9 step S19 corresponds to the FIG. 5 step S8. The FIG. 9 steps S20 and S21 correspond to the FIG. 5 step S9.

With reference to FIGS. 9 and 10, each bit line GBL is precharged initially at node CHG0 to a predetermined potential $V_{SH}$ (S11). Subsequently when word line WL is set to the $V_{LT}$ level (S12), bit line GBL is discharged by cell MC low in threshold voltage $V_{TH}$ which is not subjected to a write, and attains bit line potential $V_{SL}$ (S13).

With reference to FIG. 3, sense latch SL at comparison nodes SLR and SLS has a potential previously precharged by signals PCR and PCS, respectively, to allow $V_{SLR} < V_{SLS}$. Since in sense latch SL associated with bit line GBL discharged by the cell that is not subjected to a write, and has thus attained bit line potential $V_{SL}$, the relationship $V_{SLR} < V_{SLS}$ can be maintained as the potential of node SLS cannot be drawn. In contrast, for sense latch SL associated with bit line GBL for which a cell subjected to a write is high in threshold voltage $V_{TH}$ so that the bit line is not discharged, the relationship $V_{SLR} < V_{SLS}$ is inverted to be $V_{SLR} > V_{SLS}$ as node SLS has its potential drawn by high bit line potential. If in that condition the differential amplification circuit is operated, a latch state is established in accordance with a relationship in potential of nodes of SLS and SLR (S14).

Then, as based on information latched in sense latch SL, bit line GBL connected to cell MC having threshold voltage $V_{TH}$ less than $V_{LT}$ is selectively discharged at node CHG1 and bit line GBL connected to cell MC having threshold voltage $V_{TH}$ equal to or greater than $V_{LT}$ is selectively precharged at node CHG2 (S15). Then when word line potential is increased to $V_{VR}$ (S16) and memory is discharged, then for cell MC located at the flare, bit line GBL is discharged and $V_{SL}$ is attained, and separation from cell MC present in a normal distribution is done (S17).

Figure 11A:
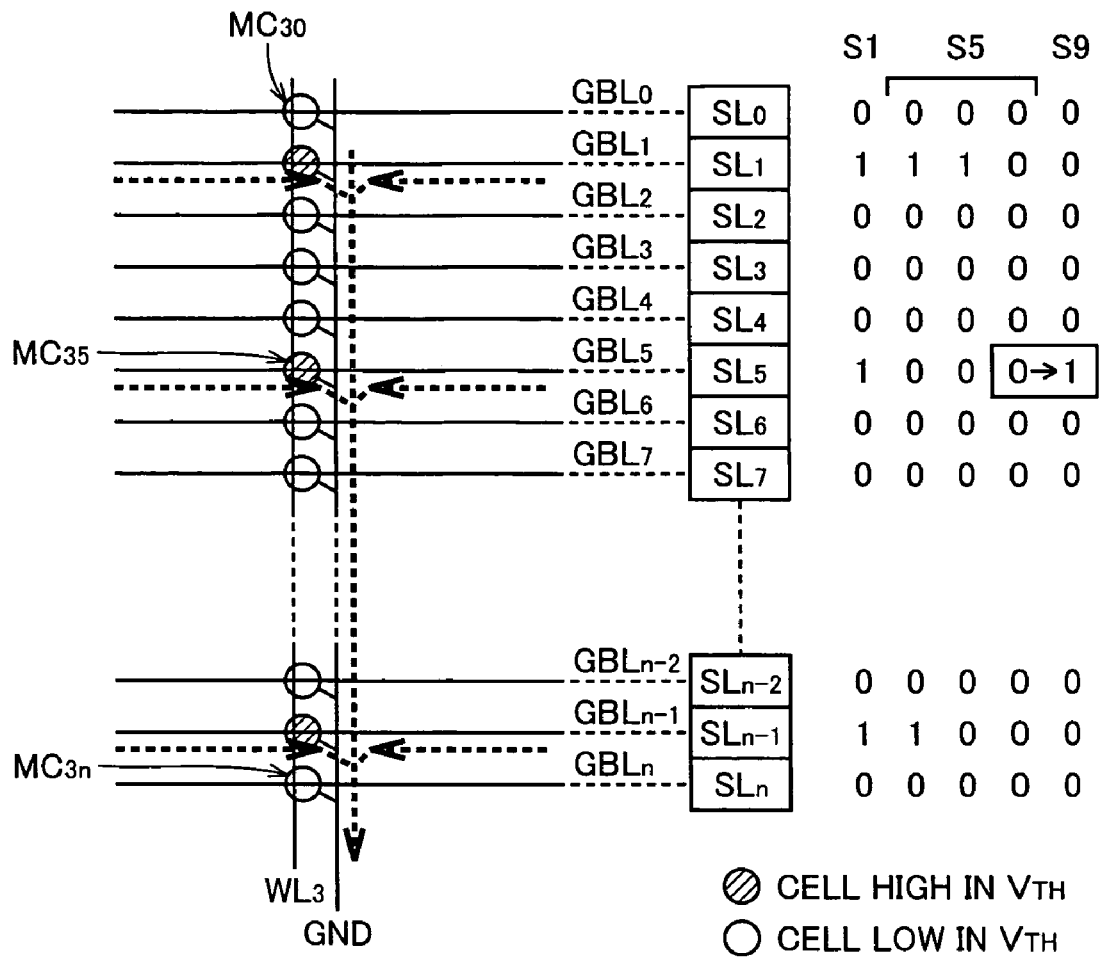
FIGS. 11A and 11B are diagrams for illustrating an effect of the first embodiment.
Figure 11B:
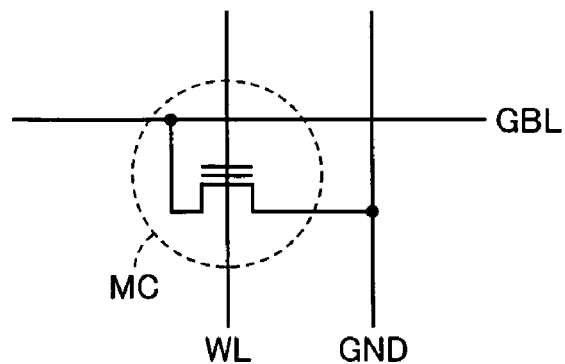

What should be noted here is that as in step S15 bit line GBL of cell MC low in threshold voltage $V_{TH}$ has completely been discharged, as shown in FIGS. 11A and 11B, memory discharging is limited to cell MC having threshold voltage $V_{TH}$ equal to or greater than $V_{LT}$. Thus, threshold voltage $V_{TH}$ can be determined more accurately than for an initial memory discharging period for which a discharging path receives a current flowing thereinto from a large number of cells MCs low in threshold voltage $V_{TH}$ and threshold voltage $V_{TH}$ is determined to be low (see FIGS. 8A and 8B).

Subsequently, when bit line GBL connected to cell MC for which a decision is previously made by the $V_{LT}$ level that it is not selected is selectively precharged, as based on latched data, again at node CHG1 to the $V_{SH}$ level (S18) and it is amplified by the differential amplification circuit together with a result of a decision made at the $V_{VR}$ level held in bit line GBL ($V_{SL}$ for the flare and $V_{SH}$ for normal), and again latched, a result of an operation of an exclusive disjunction for two levels applied to make decision, i.e., cell MC of the flare can be separated (S19).

Memory cell MC located in the flare can thus be extracted under a condition free from an effect of a discharged current of bit line GBL, and in accordance with this data, bit line GBL associated with cell MC of the flare is discharged to node CHG1 and write inhibition voltage $V_{INH}$ is applied at node CHG2 to a non-selected cell MC low in threshold voltage $V_{TH}$ and a selected cell MC high in threshold voltage $V_{TH}$ (S20). Thereafter if an additional write is performed (S21), it can selectively be done only for memory cell MC located in the flare to pull its threshold voltage $V_{TH}$ up to a level similar to that of normal cell MC.

In the first embodiment memory cell MC located in each distribution at a flare can be extracted under a condition free from an effect of a discharged current of bit line GBL. As such, by selectively performing an additional write, memory cell MC located in the flare can be pulled in threshold voltage $V_{TH}$ up to a level similar to that of normal cell MC to achieve an effectively narrowed $V_{TH}$ distribution.

Second Embodiment

Figure 12:
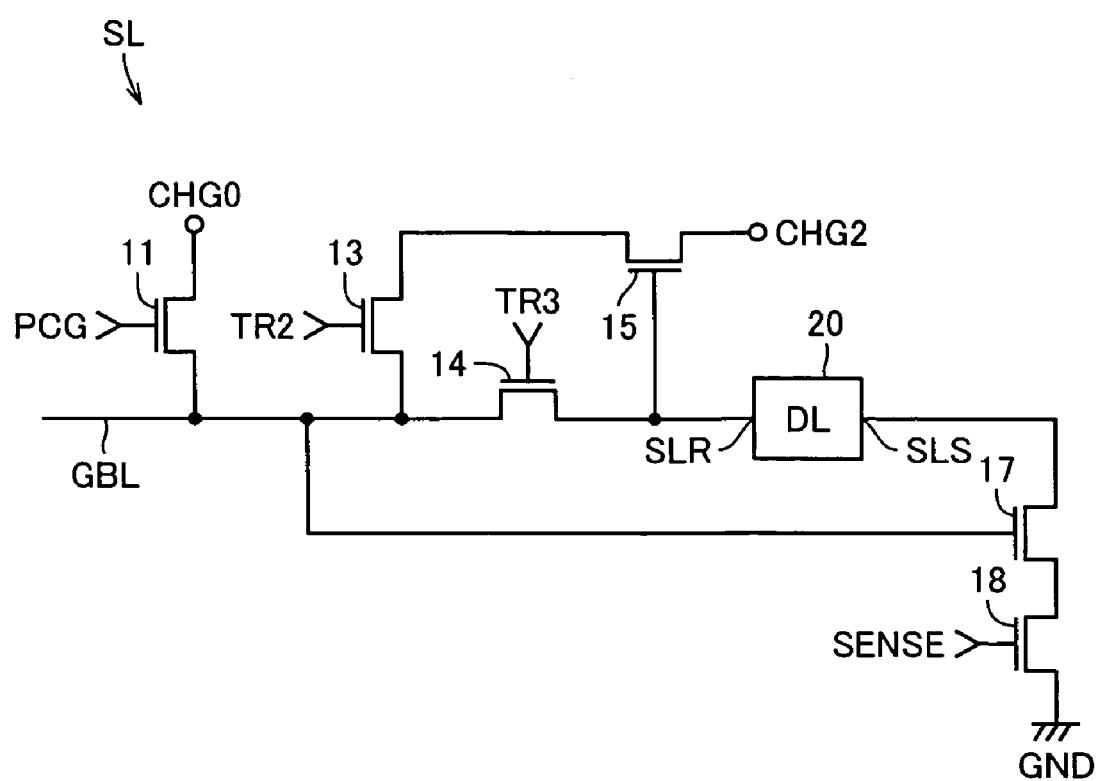
FIG. 12 is a circuit block diagram showing a configuration of a sense latch of a flash memory in a second embodiment of the present invention.
Figure 13:
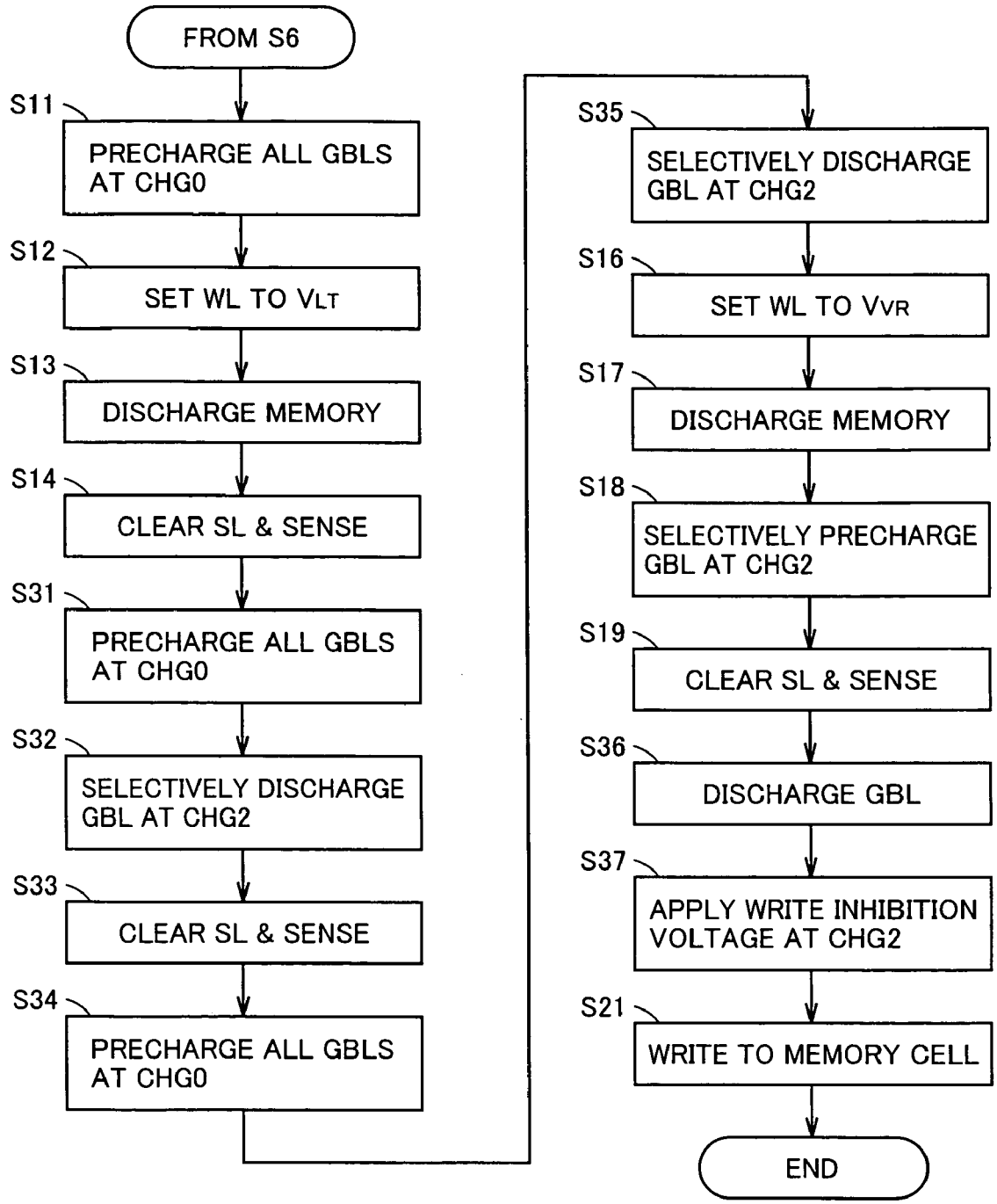
FIG. 13 is a flow chart for specifically illustrating an operation of a write operation of the flash memory as described with reference to FIG. 12 that is performed after a flare check.

FIG. 12 is a circuit diagram showing a configuration of sense latch SL of a flash memory in a second embodiment of the present invention in comparison with FIG. 3. FIG. 13 is a flow chart specifically illustrating the FIG. 5 steps S7-S9 in comparison with FIG. 9. FIG. 14 indicates the potential of bit line GBL and the variation in level of each of nodes SLR and SLS of sense latch SL for $V_{TH} \geq V_{VR}$, $V_{VR} \geq V_{TH} \geq V_{LT}$ and $V_{LT} \geq V_{TH}$ for a total of three memory cells MCs in comparison with FIG. 10. The second embodiment also adopts the configuration of the flash memory shown in FIGS. 1 and 2, and as a result of performing an initial write operation in accordance with the FIG. 5 steps S1-S6, the $V_{TH}$ distribution indicated in FIG. 7 by the broken line is obtained for the sake of illustration.

The FIG. 12 sense latch SL corresponds to the FIG. 3 sense latch SL minus two N channel MOS transistors 12 and 16 forming a current path extending from node CHG1 to bit line GBL. As such, if it is as it is, the FIG. 9 steps S15, S18 and S20 cannot be performed. However, by performing the following operation, a flare of a distribution can be detected, similarly as done with sense latch SL of FIG. 3, and its latched data can be recovered to perform an additional write.

The FIG. 13 flow chart differs from the FIG. 9 flow chart in that step S15 is substituted with steps S31-S35, at step S18 selective precharging is done at node CHG2, and step S20 is substituted with steps S36 and S37. With reference to FIGS. 13 and 14, initially, similarly as described in the first embodiment, steps S11-S14 are performed. After step S14, sense latch SL associated with memory cell MC subjected to a write, corresponding to $V_{TH} \geq V_{VR}$ and $V_{VR} \geq V_{TH} \geq V_{LT}$, has nodes SLR and SLS attaining high and low levels, respectively, and sense latch SL associated with memory cell MC that is not subjected to a write, corresponding to $V_{LT} \geq V_{TH}$, has nodes SLR and SLS attaining low and high levels, respectively. The operation up to this point is exactly the same as that of the first embodiment.

In the second embodiment a certain process referred to as a sense latch inversion process (S31-S33) is additionally performed. In this process, initially bit line GBL is again precharged at node CHG0 to a predetermined potential $V_{SH}$ (S31). Thereafter, in accordance with data of sense latch SL, bit line GBL is selectively discharged at node CHG2 (S32). As a result, bit line GBL is discharged that is connected to sense latch SL having nodes SLS and SLR set low and high, respectively, in level as high voltage remains in bit line GBL because threshold voltage $V_{TH}$ is high when a read is previously performed with the $V_{LT}$ level. In contrast, bit line GBL is not selectively discharged and instead its precharged level is maintained for sense latch SL having nodes SLS and SLR set high and low, respectively, in level as bit line GBL is discharged because $V_{TH}$ is low when a read is previously performed with the $V_{LT}$ level. More specifically, an inversion of a potential provided in bit line GBL in a previous read at $V_{LT}$, will be provided. As such, if the data of sense latch SL formed in the previous read is then cleared and a sense operation is performed in accordance with a level of bit line GBL that is again, newly formed, desired inverted data can be formed in sense latch SL.

The inverted data is formed in sense latch SL in order to perform on a current path extending from bit line GBL to node CHG2 the selectively discharge performed in the first embodiment on that extending from bit line GBL to node CGH1. More specifically, if bit line GBL is again precharged at node CHG0 to a predetermined potential $V_{SH}$ (S34) and bit line GBL is selectively discharged at node CHG2, as based on latched information (S35), bit line GBL connected to cell MC having threshold voltage $V_{TH}$ less than $V_{LT}$ is selectively discharged as node SLR has the high level. A potential similar to that of the first embodiment can thus be achieved.

Subsequently if word line WL is increased in potential to $V_{VR}$ (S16) and memory is discharged, then for cell MC located in a flare, bit line GBL is discharged and the $V_{SL}$ level is attained, and separation from cell MC located in a normal distribution can be provided (S17). What should be noted herein is that, as well as in the first embodiment, in step S35 bit line GBL for cell MC low in threshold voltage $V_{TH}$ has completely been discharged, as shown in FIGS. 11A and 11B, memory discharging is limited to cell MC having threshold voltage $V_{TH}$ equal to or greater than $V_{LT}$. Thus, threshold voltage $V_{TH}$ can be determined more accurately than for an initial memory discharging period for which a discharging path receives a current flowing thereinto from a large number of cells MCs low in threshold voltage $V_{TH}$ and threshold voltage $V_{TH}$ is determined to be low (see FIGS. 8A and 8B).

Subsequently, when bit line GBL connected to cell MC for which a decision is previously made by the $V_{LT}$ level that it is not selected is selectively precharged, as based on latched data, again at node CHG2 to the $V_{SH}$ level (S18) and it is amplified by the differential amplification circuit together with a result of a decision made at the $V_{VR}$ level held in bit line GBL ($V_{SL}$ for the flare and $V_{SH}$ for normal), and again latched, a result of an operation of an exclusive disjunction for two levels applied to make decision, i.e., a cell of the flare can be separated (S19).

Memory cell MC located in the flare can thus be extracted under a condition free from an effect of a discharged current of bit line GBL, and if in accordance with this data, write inhibition voltage $V_{INH}$ is applied to a non-selected cell MC low in threshold voltage $V_{TH}$ and a selected cell MC high in threshold voltage $V_{TH}$ (S36, S37) and an additional write is performed (S21), it can selectively be done only for memory cell MC located in the flare to pull its threshold voltage $V_{TH}$ up to a level similar to that of normal cell MC.

In the second embodiment memory cell MC located in each distribution at a flare can be extracted under a condition free from an effect of a discharged current of bit line GBL.

As such, by selectively performing an additional write, memory cell MC located in the flare can be pulled in threshold voltage $V_{TH}$ up to a level similar to that of normal cell MC to achieve an effectively narrowed $V_{TH}$ distribution as well as in the first embodiment.

Third Embodiment

Figure 15:
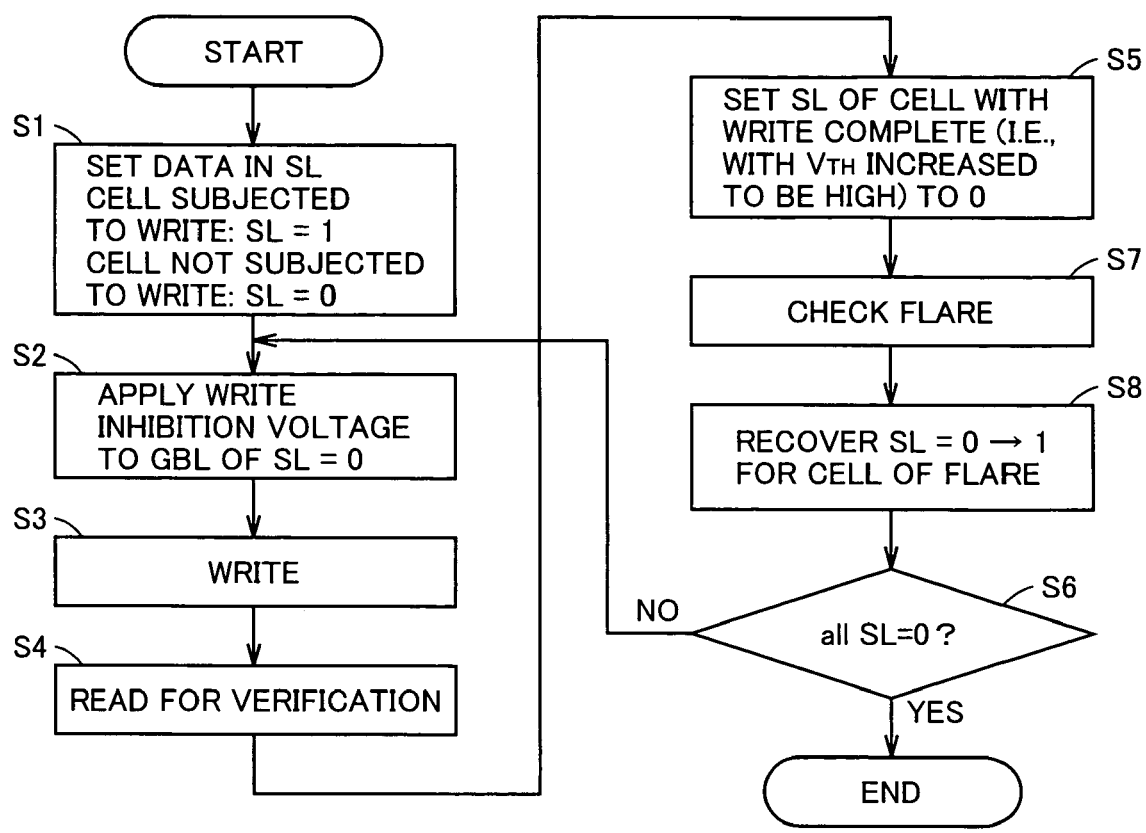
FIGS. 15, 16 and 17 are flow charts for illustrating write operations of flash memories in third, fourth and fifth embodiments, respectively, of the present invention.

FIG. 15 is a flow chart of a method of writing to a flash memory in a third embodiment of the present invention in comparison to FIG. 5.

With reference to the figure, the FIG. 15 method differs from the FIG. 5 method in that a flare of a distribution is checked (S7) and a process that recovers sense-latched data from 0 to 1 for cell MC located in the flare is performed (S8) before a decision on whether latches are all 0 is made (S6). More specifically, in the first and second embodiments a decision in connection with a flare is made after a write has been done for all of cells MCs subjected to the write, whereas in the third embodiment such decision is made each time as a normal write process is performed. This allows the additional write process (S9) performed in the first and second embodiments to be performed together with the normal write process (S2, S3).

In the third embodiment, as well as the first and second embodiments, memory cell MC located in each distribution at a flare can be extracted under a condition free from an effect of a discharged current of bit line GBL, and by again subjecting cell MC for which a decision is once made that a write therein is completed to a write, the memory cell's threshold voltage $V_{TH}$ can be pulled up to a level similar to that of normal cell MC.

Fourth Embodiment

Figure 16:
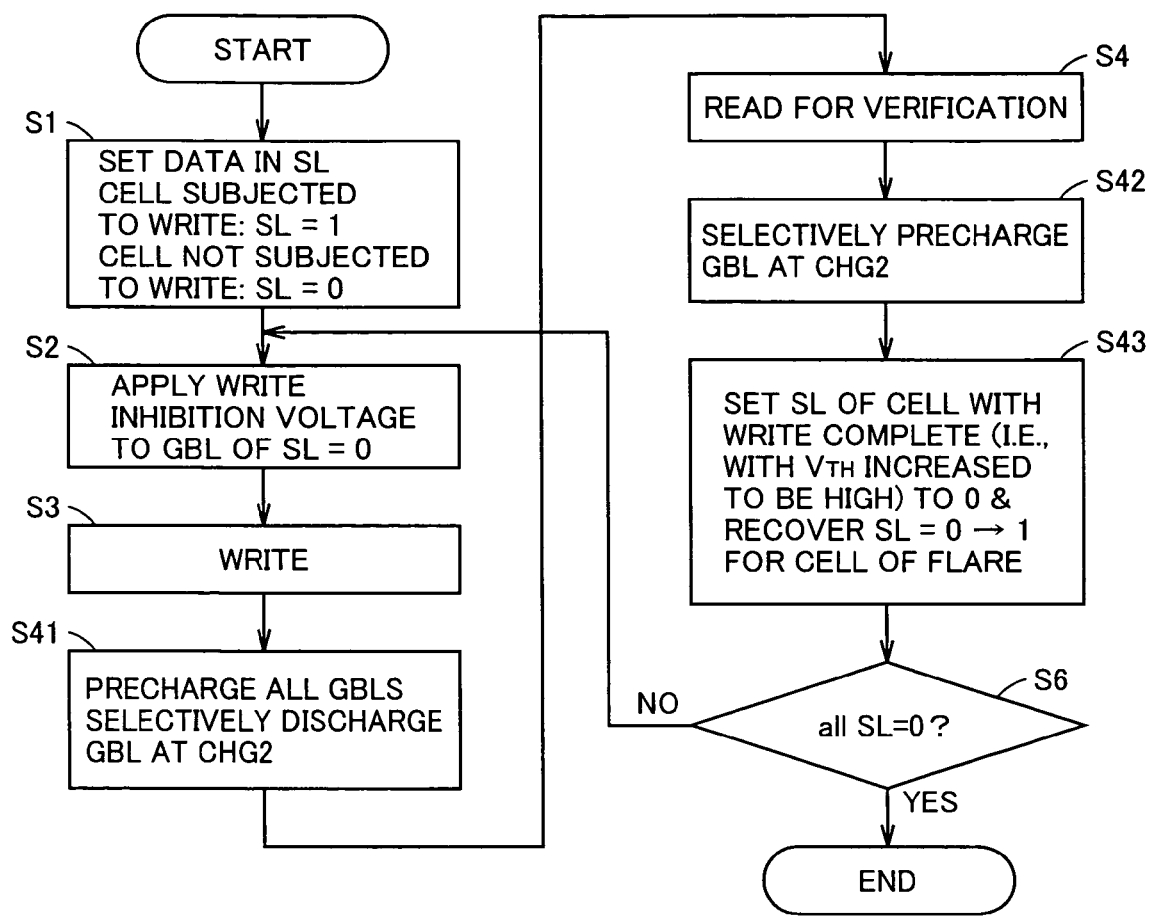

FIG. 16 is a flow chart of a method of writing to a flash memory in a fourth embodiment of the present invention in comparison to FIG. 15.

With reference to FIG. 16, the FIG. 16 method differs from the FIG. 15 method in that after the normal write process (S3) and before the read for verification (S4) all bit lines GBLs are precharged and thereafter bit line GBL connected to cell MC that is not subjected to a write is previously discharged at node CHG2 (S41) and after the read for verification (S4) bit line GBL connected to cell MC that is not subjected to the write is selectively precharged at node CHG2 to the $V_{SH}$ level (S42). This allows the normal read for verification (S4) and the decision made in connection with a flare of a distribution (S12-S81) to be collectively performed to contribute to a simplified process.

The fourth embodiment, as well as the third embodiment, checks a flare of a distribution (S7) and performs a process that recovers sense-latched data from 0 to 1 for a cell located in the flare (S8) before a decision on whether latches are all 0 is made (S6). More specifically, in the first and second embodiments a decision in connection with a flare is made after a write has been done for all of cells subjected to the write, whereas in the fourth embodiment such decision is made each time as a normal write process is performed. This allows the additional write process (S18-S20) performed in the first and second embodiments to be performed together with the normal write process (S2, S3).

In the fourth embodiment, as well as the first to third embodiments, memory cell MC located in each distribution at a flare can be extracted under a condition free from an effect of a discharged current of bit line GBL, and by again subjecting cell MC for which a decision is once made that a write therein is completed to a write, the memory cell's threshold voltage $V_{TH}$ can be pulled up to a level similar to that of normal cell MC.

Fifth Embodiment

Figure 17:
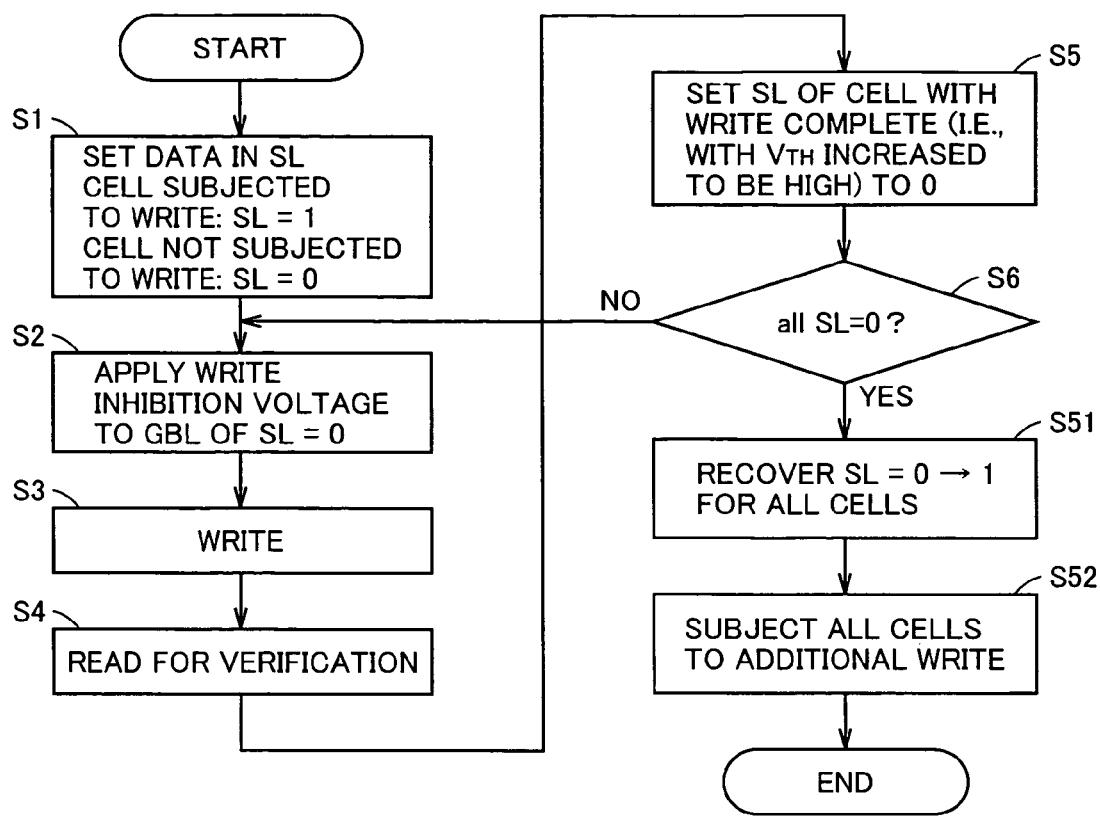
Figure 18:
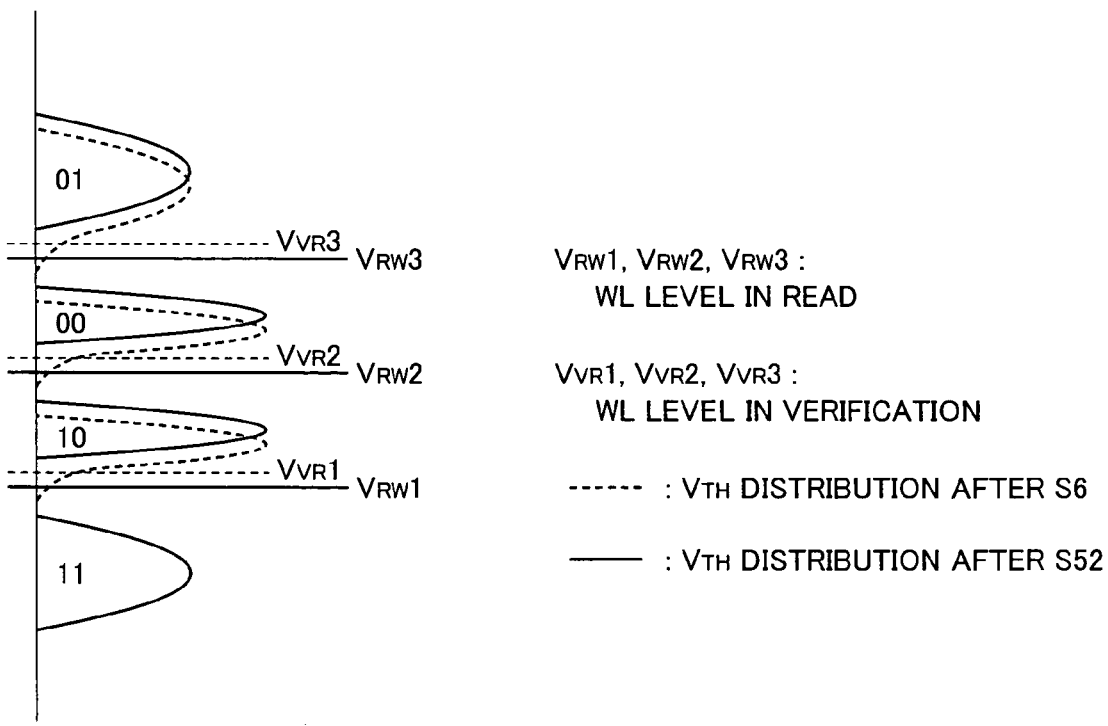
FIG. 18 represents a relationship between a distribution of $V_{TH}$ and a level applied to make a decision for the flash memory described with reference to FIG. 17.

FIG. 17 is a flow chart of a method of writing to a flash memory in a fifth embodiment of the present invention in comparison to FIG. 5. FIG. 18 represents a $V_{TH}$ distribution of memory cell MC and a potential of word line WL in comparison to FIG. 7.

With reference to FIGS. 17 and 18 the FIG. 17 method differs from a conventional system and the first to fourth embodiments in that a low word line voltage $V_{VR}$ is employed to perform a read for verification. As a result when a normal write process is completed (S6) the distribution is located at a position lower than a desired distribution indicated by a solid line, as indicated in FIG. 18 by a broken line.

As has been described in connection with a conventional, technological disadvantage, a flare of a distribution is formed by cell MC for which (a decision is erroneously made that) a write has been completed in an earlier stage of a write process while a large number of cells MCs are still in the on state. In other words, it can be said that memory cell MC that forms the flare is cell MC that more readily increases in threshold voltage $V_{TH}$ than other memory cell MC.

The fifth embodiment utilizes this feature, i.e., after a write is completed for all memory cells MCs, all sense latches SLs have their data recovered from 0 to 1 (S51) and a weak write pulse is applied to all cells MCs uniformly to finish up the write (S52). This is why a verification level of the normal write process is set to be low. A weak write writes to memory cell MC under such a writing condition that the amount of electric charge introduced into memory cell MC is smaller than the normal write does (step S3). Herein the amount of electric charge introduced is proportional to (a write voltage applied to memory cell MC between the control gate and the drain)×(the width of the pulse of the write voltage)×(how many times the pulses is applied). Accordingly, the weak write is implemented by decreasing the write voltage, reducing the width of the pulse of the write voltage (i.e., applying the write voltage for a shorter period of time), and applying the pulse less frequently than in the normal write.

In the fifth embodiment, as well as in the first to fourth embodiments, memory cell MC matching a flare of each distribution can be lifted at more significantly than other memory cell MC as the fact is utilized that the former cell has such a characteristic that it is more readily to finish writing therein. As such, its voltage $V_{TH}$ can be pulled up to a level similar to that of a normal memory cell MC, and a narrowed $V_{TH}$ distribution can effectively be achieved.

Sixth Embodiment

Figure 19:
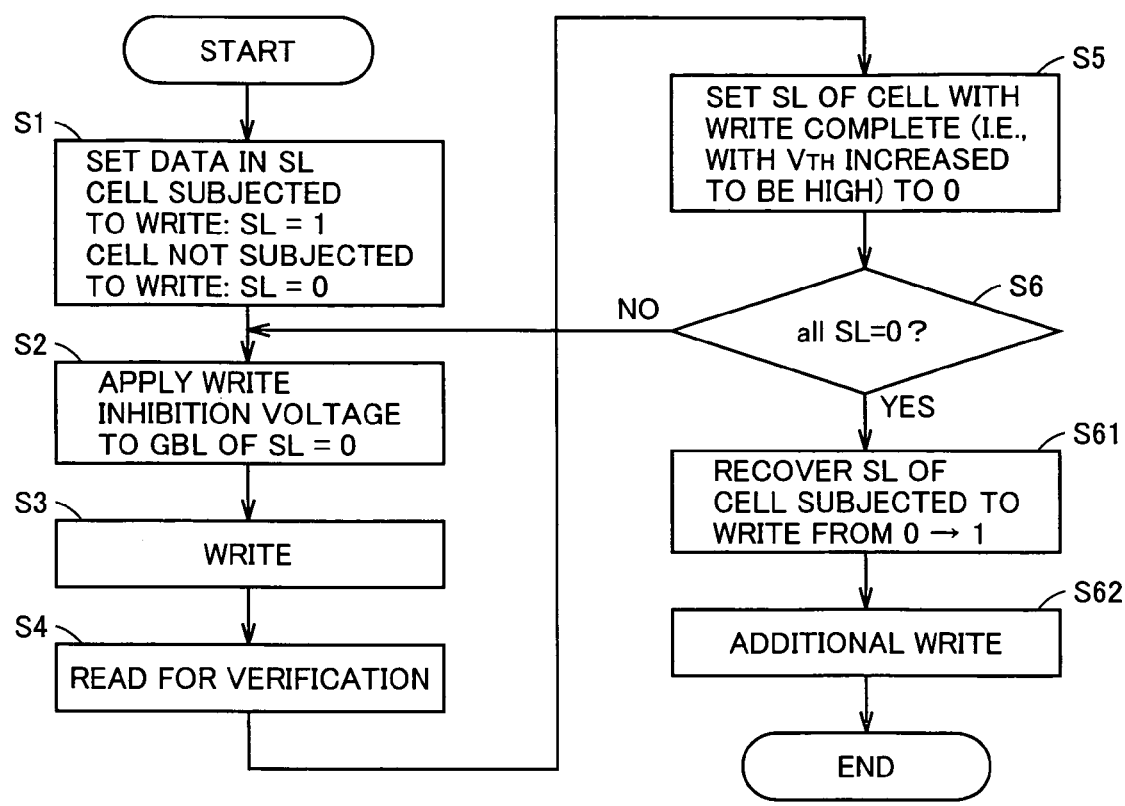
FIG. 19 is a flow chart for illustrating a write operation of a flash memory in a sixth embodiment of the present invention.

FIG. 19 is a flow chart of a method of writing to a flash memory in a sixth embodiment of the present invention in comparison to FIG. 17.

As well as the fifth embodiment, the sixth embodiment also employs the low verification level $V_{VR}$ shown in FIG. 18 to normally perform a write and a decision in connection with a flare is not made. More specifically, as well as in the fifth embodiment, a feature of memory cell MC located in a flare is utilized to achieve a narrowed distribution.

The sixth embodiment differs from the fifth embodiment in that data that is additionally written after a normally write is completed is recovered from 0 to 1 only for cell MC subjected to a write (S61, S62). The data of cell MC subjected to the write may be taken in from input data control circuit 7 set in step S1 or may be obtained by performing a former half of the process performed to make a decision in connection with a flare, as indicated in the first and second embodiments, i.e., by reading at the $V_{LT}$ level (S11-14, S31-S33).

The sixth embodiment subjects only cell MC that is subjected to a write to an additional write. As such, in comparison with the fifth embodiment, the present embodiment has such a feature that cell MC that is not subjected to the write does not undergo a useless write process.

In the sixth embodiment, as well as in the first to fifth embodiments, memory cell MC matching a flare of each distribution can be lifted at more significantly than other memory cell MC as the fact is utilized that the former cell has such a characteristic that it is more readily to finish writing therein. As such, its voltage $V_{TH}$ can be pulled up to a level similar to that of a normal memory cell MC, and a narrowed $V_{TH}$ distribution can effectively be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a non-volatile semiconductor memory device having a plurality of memory cells arranged in a plurality of rows and a plurality of columns and each storing information by variation in threshold voltage, a plurality of word lines associated with said plurality of rows, respectively, a plurality of bit lines associated with said plurality of columns, respectively, and a plurality of sense latches associated with said plurality of bit lines, respectively, a method of writing information to each of said plurality of memory cells, comprising the steps of:

(1) causing each sense latch corresponding to a memory cell of a plurality of memory cells associated with one selected word line that is subjected to a write to latch a first signal, and causing each sense latch associated with a memory cell that is not subjected to said write to latch a second signal;

(2) performing said write to and verifying each of said plurality of memory cells associated with said selected word line that is associated with said sense latch latching said first signal, and causing each sense latch associated with said memory cell said write to which is completed to latch said second signal; and (3) re-verifying said memory cell subjected to said write, and causing each sense latch associated with said memory cell such detected that said write therein is insufficiently done to latch said first signal, wherein in re-verifying said memory cell subjected to said write, each bit line associated with said memory cell that is not subjected to said write is previously discharged.

2. The method according to claim 1, until said plurality of sense latches all latch said second signal, the step (2) repeating performing said write to and verifying said plurality of memory cells associated with said selected word line, the method further comprising the step of (4) performing a write to each memory cell associated with said sense latch latching said first signal.

3. The method according to claim 1, wherein if in the step (3) there is any sense latch latching said first signal, the step (2) is again performed.

4. The method according to claim 1, wherein in the step (3), re-verifying and detecting a memory cell said write in which is insufficiently done is performed such that each bit line associated with said memory cell subjected to said write is precharged and each bit line associated with said memory cell that is not subjected to said write is discharged, and a re-verification voltage is applied to said selected word line and each bit line associated with a memory cell having a threshold voltage of at most said re-verification voltage is discharged and thereafter each bit line associated with said memory cell that is not subjected to said write is precharged.

5. The method according to claim 1, wherein the step (3) precharges each bit line associated with said memory cell subjected to said write and also discharges each bit line associated with said memory cell that is not subjected to said write by precharging all of said plurality of bit lines and thereafter applying a voltage to said selected word line to make, said voltage being lower than a voltage applied in the step of verifying.

6. In a non-volatile semiconductor memory device having a plurality of memory cells arranged in a plurality of rows and a plurality of columns and each storing information by variation in threshold voltage, a plurality of word lines associated with said plurality of rows, respectively, a plurality of bit lines associated with said plurality of columns, respectively, and a plurality of sense latches associated with said plurality of bit lines, respectively, a method of writing information to each of said plurality of memory cells, comprising the steps of:

(1) causing each sense latch corresponding to a memory cell of a plurality of memory cells associated with one selected word line that is subjected to a write to latch a first signal, and causing each sense latch associated with a memory cell that is not subjected to said write to latch a second signal;

(2) performing said write to and verifying with a verification voltage each of said plurality of memory cells associated with said selected word line that is associated with said sense latch latching said first signal, and causing each sense latch associated with said memory cell said write to which is completed to latch said second signal;

(3) after repeating the step (2) to cause said plurality of sense latches to all latch said second signal, causing said plurality of sense latches to all latch said first signal; and (4) performing a write, in a writing condition different from that in the step (2), to each memory cell associated with said sense latch latching said first signal.

7. The method according to claim 6, wherein the step (4) of performing a write is performed under such a condition that an amount of electric charge introduced into said memory cell is smaller than in the step (2) of performing said write.

8. In a non-volatile semiconductor memory device having a plurality of memory cells arranged in a plurality of rows and a plurality of columns and each storing information by variation in threshold voltage, a plurality of word lines associated with said plurality of rows, respectively, a plurality of bit lines associated with said plurality of columns, respectively, and a plurality of sense latches associated with said plurality of bit lines, respectively, a method of writing information to each of said plurality of memory cells, comprising the steps of:

(1) causing each sense latch corresponding to a memory cell of a plurality of memory cells associated with one selected word line that is subjected to a write to latch a first signal, and causing each sense latch associated with a memory cell that is not subjected to said write to latch a second signal;

(2) performing said write to and verifying with a verification voltage each of said plurality of memory cells associated with said selected word line that is associated with said sense latch latching said first signal, and causing each sense latch associated with said memory cell said write to which is completed to latch said second signal;

(3) after repeating the step (2) to cause said plurality of sense latches to all latch said second signal, causing each sense latch associated with said memory cell subjected to said write to latch said first signal; and (4) performing a write, in a writing condition different from that in the step (2), to each memory cell associated with said sense latch latching said first signal.

9. The method according to claim 8, wherein the step (4) of performing a write is performed under such a condition that an amount of electric charge introduced into said memory cell is smaller than in the step (2) of performing said write.

* * * * *